(12) United States Patent
Daubenspeck et al.

(10) Patent No.: US 7,547,576 B2
(45) Date of Patent: Jun. 16, 2009

(54) SOLDER WALL STRUCTURE IN FLIP-CHIP TECHNOLOGIES

(75) Inventors: Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/275,867

(22) Filed: Feb. 1, 2006

(65) Prior Publication Data

US 2006/0087035 A1    Apr. 27, 2006
US 2007/0176288 A1    Aug. 2, 2007

(51) Int. Cl.
*H01L 21/00* (2006.01)
(52) U.S. Cl. .................. 438/108; 438/106; 438/117; 438/121; 257/E23.002
(58) Field of Classification Search ............... 438/106, 438/108, 117, 121
See application file for complete search history.

(56) References Cited

U.S. PATENT DOCUMENTS

| | | | |
|---|---|---|---|
| 5,821,161 A | 10/1998 | Covell, II et al. | |
| 5,881,944 A | 3/1999 | Edwards et al. | |
| 5,904,499 A | 5/1999 | Pace | |
| 5,982,038 A | 11/1999 | Toy et al. | |
| 6,046,074 A | 4/2000 | McHerron et al. | |
| 6,165,820 A | 12/2000 | Pace | |
| 6,238,951 B1* | 5/2001 | Caillat | 438/108 |
| 6,376,915 B1* | 4/2002 | Hikita et al. | 257/777 |
| 6,404,040 B1* | 6/2002 | Hikita et al. | 257/630 |
| 6,808,955 B2* | 10/2004 | Ma | 438/51 |
| 6,956,291 B1* | 10/2005 | Li | 257/778 |
| 7,141,869 B2* | 11/2006 | Kim et al. | 257/673 |

* cited by examiner

*Primary Examiner*—N Drew Richards
*Assistant Examiner*—Christy L Novacek
(74) *Attorney, Agent, or Firm*—Schmeiser, Olsen & Watts; William D. Sabo

(57) ABSTRACT

A structure and method for forming the same. The semiconductor structure includes a first semiconductor chip and N solder bumps in direct physical contact with the first semiconductor chip, wherein N is a positive integer. The semiconductor structure also includes a first solder wall on a perimeter of the first semiconductor chip such that the first solder wall forms a closed loop surrounding the N solder bumps.

1 Claim, 10 Drawing Sheets

SOLDER WALL STRUCTURE IN FLIP-CHIP TECHNOLOGIES

BACKGROUND OF THE INVENTION

1. Technical Field

The present invention relates to flip-chip technologies, and more specifically, to a solder wall structure in flip-chip technologies.

2. Related Art

In typical flip-chip technologies, solder bumps are formed on top of a chip to help bond the chip to a ceramic substrate. These solder bumps may be corroded by carbon dioxide and water vapor of the surrounding ambient environment. Therefore, there is a need for a structure (and a method for forming the same), in which the solder bumps are not corroded by carbon dioxide and water vapor of the surrounding ambient.

SUMMARY OF THE INVENTION

The present invention provides a semiconductor structure, comprising (a) a first semiconductor chip; (b) N solder bumps in direct physical contact with the first semiconductor chip, wherein N is a positive integer; and (c) a first solder wall on a perimeter of the first semiconductor chip such that the first solder wall forms a closed loop surrounding the N solder bumps.

The present invention also provides a semiconductor fabrication method, comprising providing a first semiconductor chip; forming N solder bumps in direct physical contact with the first semiconductor chip, wherein N is a positive integer; and forming a first solder wall on a perimeter of the first semiconductor chip such that the first solder wall forms a closed loop surrounding the N solder bumps.

The present invention also provides a semiconductor structure, comprising (a) a first semiconductor chip comprising a crack stop on a perimeter of the first semiconductor chip; (b) N solder bumps in direct physical contact with the first semiconductor chip, wherein N is a positive integer; (c) a first solder wall on a perimeter of the first semiconductor chip such that the first solder wall forms a closed loop surrounding the N solder bumps, and such that the first solder wall is overlapping the crack stop; and (d) a module substrate coupled to the first solder wall and the N solder bumps Therefore, there is a need for a structure (and a method for forming the same), in which the solder bumps are not corroded by carbon dioxide and water vapor of the surrounding ambient.

BRIEF DESCRIPTION OF THE DRAWINGS

FIG. 1Fi shows a top-down view of the semiconductor structure of FIG. 1F, in accordance with embodiments of the present invention.

FIG. 1Gi shows a top-down view of a semiconductor chip after it is cut from the semiconductor structure of FIG. 1G, in accordance with embodiments of the present invention.

DETAILED DESCRIPTION OF THE INVENTION

Figure 1A:
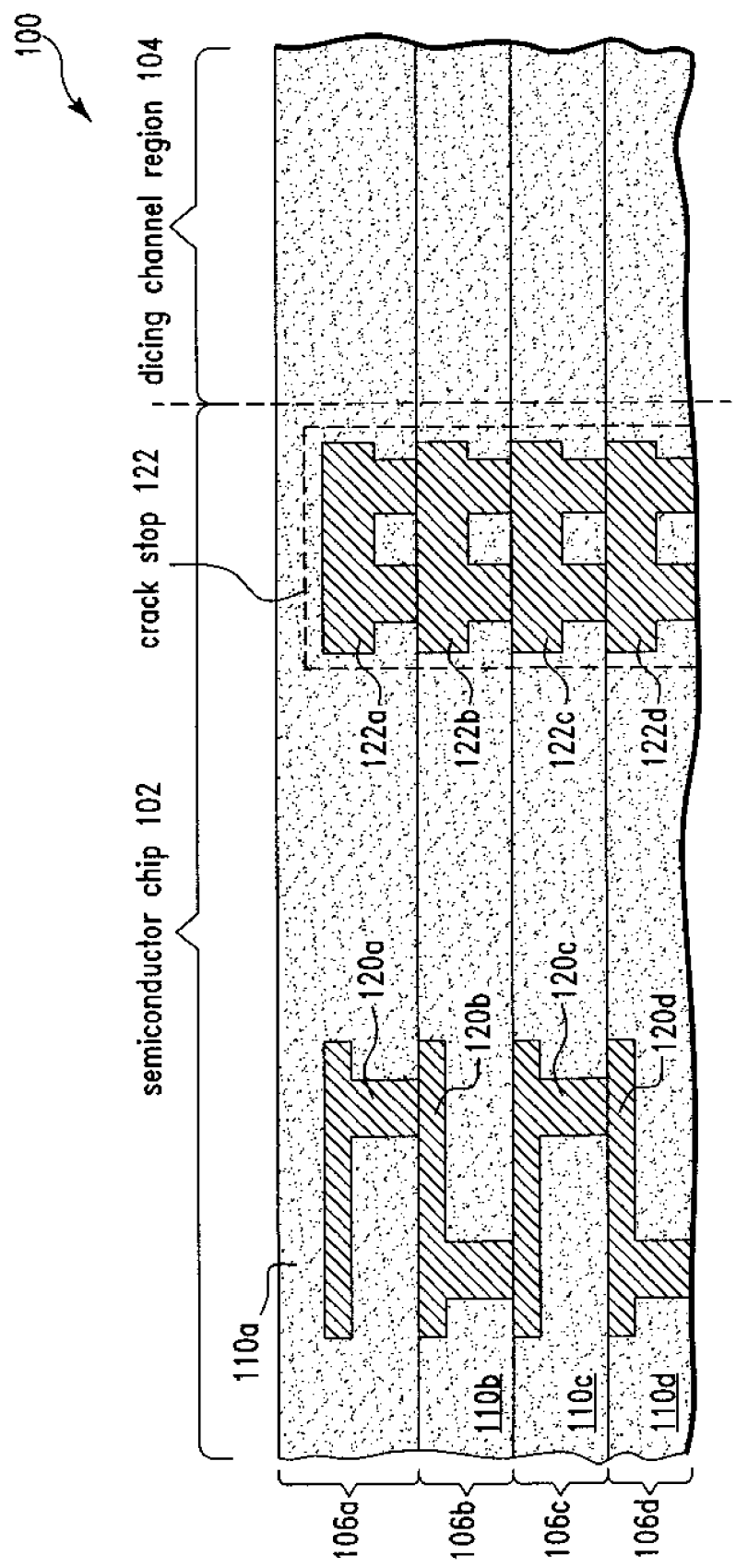
FIGS. 1A-1G illustrate a fabrication method for forming a semiconductor structure, in accordance with embodiments of the present invention.

FIGS. 1A-1G illustrate a fabrication method for forming a semiconductor structure 100, in accordance with embodiments of the present invention. More specifically, with reference to FIG. 1A, in one embodiment, the fabrication of the semiconductor structure 100 starts with a semiconductor chip 102 and a dicing channel region 104. The semiconductor chip 102 comprises multiple interconnect layers 106a, 106b, 106c, and 106d. There may be additional device layers in a silicon substrate of the semiconductor chip 102 beneath and coupled to the interconnect layer 106d, but these additional device layers and the silicon substrate are not shown for simplicity. In the embodiment described above, there are only four interconnect layers 106a, 106b, 106c, and 106d. In general, the semiconductor chip 102 can have N interconnect layers, wherein N is a positive integer.

In one embodiment, the top interconnect layer 106a of the semiconductor chip 102 includes (i) a dielectric layer 110a, (ii) an electrically conducting line 120a (comprising copper (Cu) in one embodiment) embedded in the dielectric layer 110a, and (iii) a metal region 122a (comprising Cu in one embodiment) embedded in the dielectric layer 110a. Similarly, the interconnect layers 106b, 106c, and 106d comprise dielectric layers 110b, 110c, and 110d, electrically conducting lines 120b, 120c, and 120d (comprising Cu in one embodiment), and metal regions 122b, 122c, and 122d (comprising Cu in one embodiment), respectively. In one embodiment, the metal regions 122a, 122b, 122c, and 122d run on a perimeter of the semiconductor chip 102 and form a crack stop 122 surrounding the semiconductor chip 102. In one embodiment, the crack stop 122 is to prevent cracking from propagating from the dicing channel region 104 to the semiconductor chip 102 during a chip dicing process. It should be noted that from FIG. 1B to FIG. 1G, a bottom part of the structure 100, which comprises the interconnect layers 106b, 106c, and 106d, is omitted for simplicity, the only top interconnect layer 106a is shown.

Figure 1B:
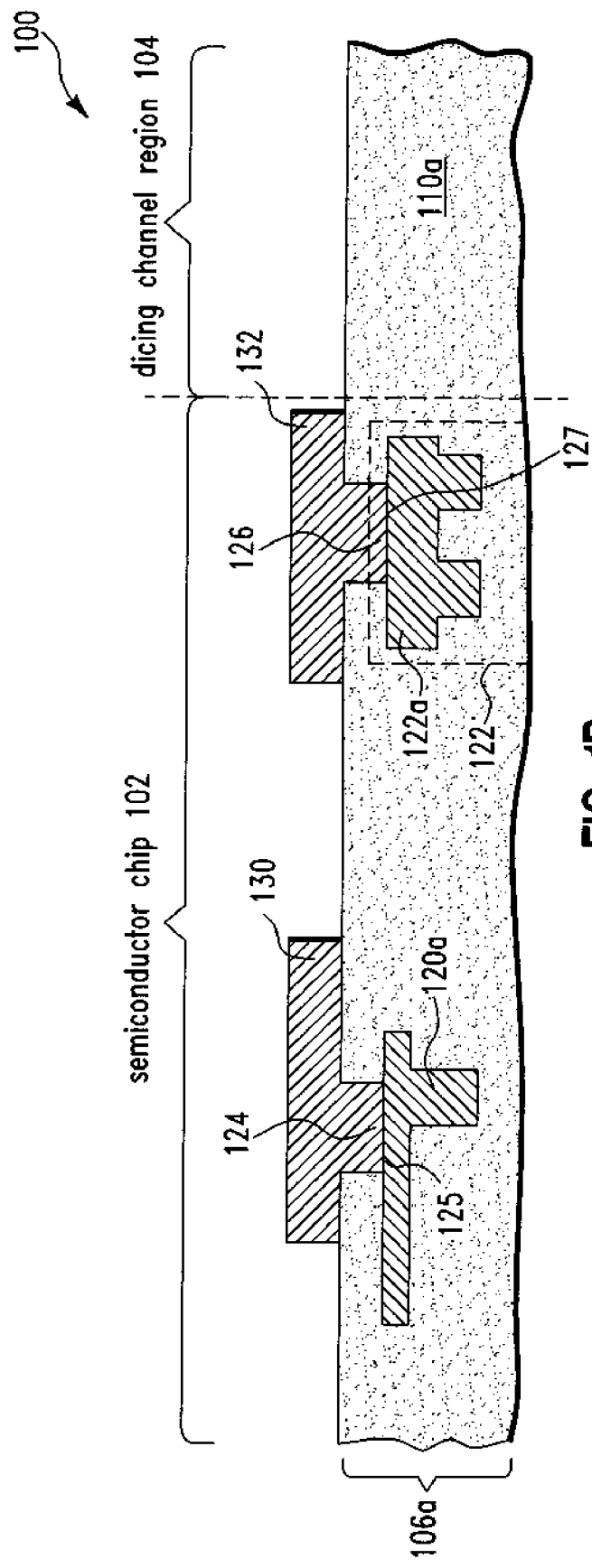

Next, with reference to FIG. 1B, in one embodiment, portions of the dielectric layer 110a are removed so as to create a hole 124 and a trench 126 such that top surfaces 125 and 127 of the Cu line 120a and the crack stop 122, respectively, are exposed to the surrounding ambient. In one embodiment, the trench 126 runs along the crack stop 122 of the chip 102.

Next, in one embodiment, a bond pad 130 (comprising aluminum (Al) in one embodiment) is formed on top of the Cu line 120a and the dielectric layer 110a such that the Al bond pad 130 is electrically coupled to the Cu line 120a. In one embodiment, a wall base 132 (comprising Al in one embodiment) is formed on top of the crack stop 122 and the dielectric layer 110a such that the Al wall base 132 is in direct physical contact with the crack stop 122. Illustratively, the Al bond pad 130 and the Al wall base 132 can be simultaneously formed by (a) forming an Al layer (not shown) on the entire structure 100, and then (b) directionally and selectively etching back the Al layer stopping at the dielectric layer 110a. The directional and selective etching in step (b) may be performed using a traditional lithographic and etching process such that what remains of the Al layer after the etching are the Al bond pad 130 and the Al wall base 132 (as shown in FIG. 1B). In one embodiment, the Al wall base 132 runs along the crack stop 122 of the chip 102 (i.e. the Al wall base 132 runs on the perimeter of the semiconductor chip 102).

Figure 1C:
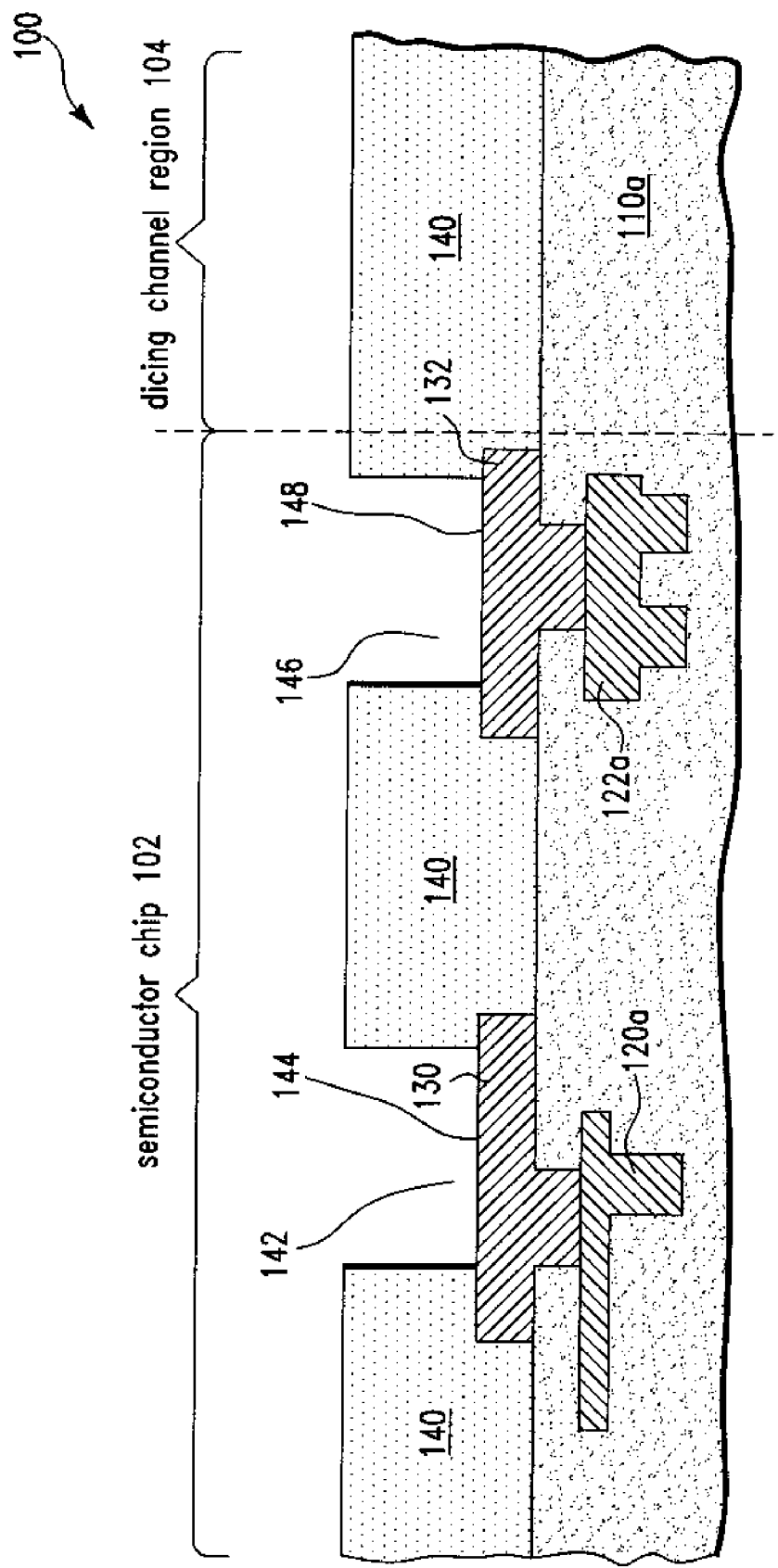

Next, with reference to FIG. 1C, in one embodiment, a patterned support/interface layer 140 (comprising polyimide in one embodiment) is formed on top of the entire structure 100 of FIG. 1B. In one embodiment, the patterned support/interface layer 140 comprises a hole 142 and a trench 146 such that (i) a top surface 144 of the Al bond pad 130 is exposed to the surrounding ambient environment via the hole 142 and (ii) a top surface 148 of the Al wall base 132 is exposed to the surrounding ambient environment via the trench 146. In one embodiment, the trench 146 runs along the Al wall base 132 of the chip 102 (i.e. the trench 146 runs on the perimeter of the semiconductor chip 102).

In one embodiment, the patterned support/interface layer 140 is formed using a photosensitive method. More specifically, the patterned support/interface layer 140 is formed by (i) spin-applying a polyimide film (not shown) on the structure 100 of FIG. 1B, (ii) then curing the polyimide film at a high temperature, (iii) then exposing the polyimide film to light through a mask (not shown) in a photo stepper lithographic tool (not shown), (iv) and then developing the polyimide film so as to form the patterned support/interface layer 140. It should be noted that polyimide is a photosensitive polymer. In general, other photosensitive polymers may be used instead of polyimide.

Figure 1D:
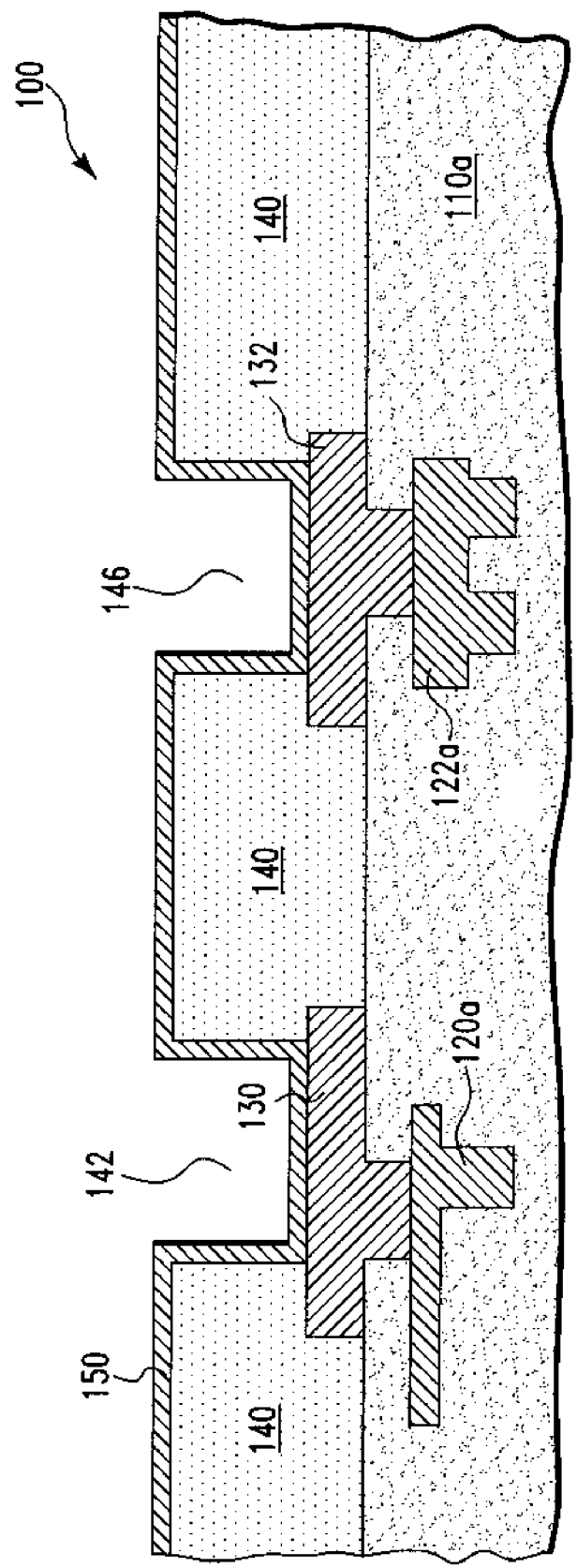

Next, with reference to FIG. 1D, in one embodiment, a bump limiting metallurgy (BLM) film 150 is formed on top of the entire structure 100 of FIG. 1C by, illustratively, sputter deposition or plating or a combination of sputter deposition and plating.

Figure 1E:
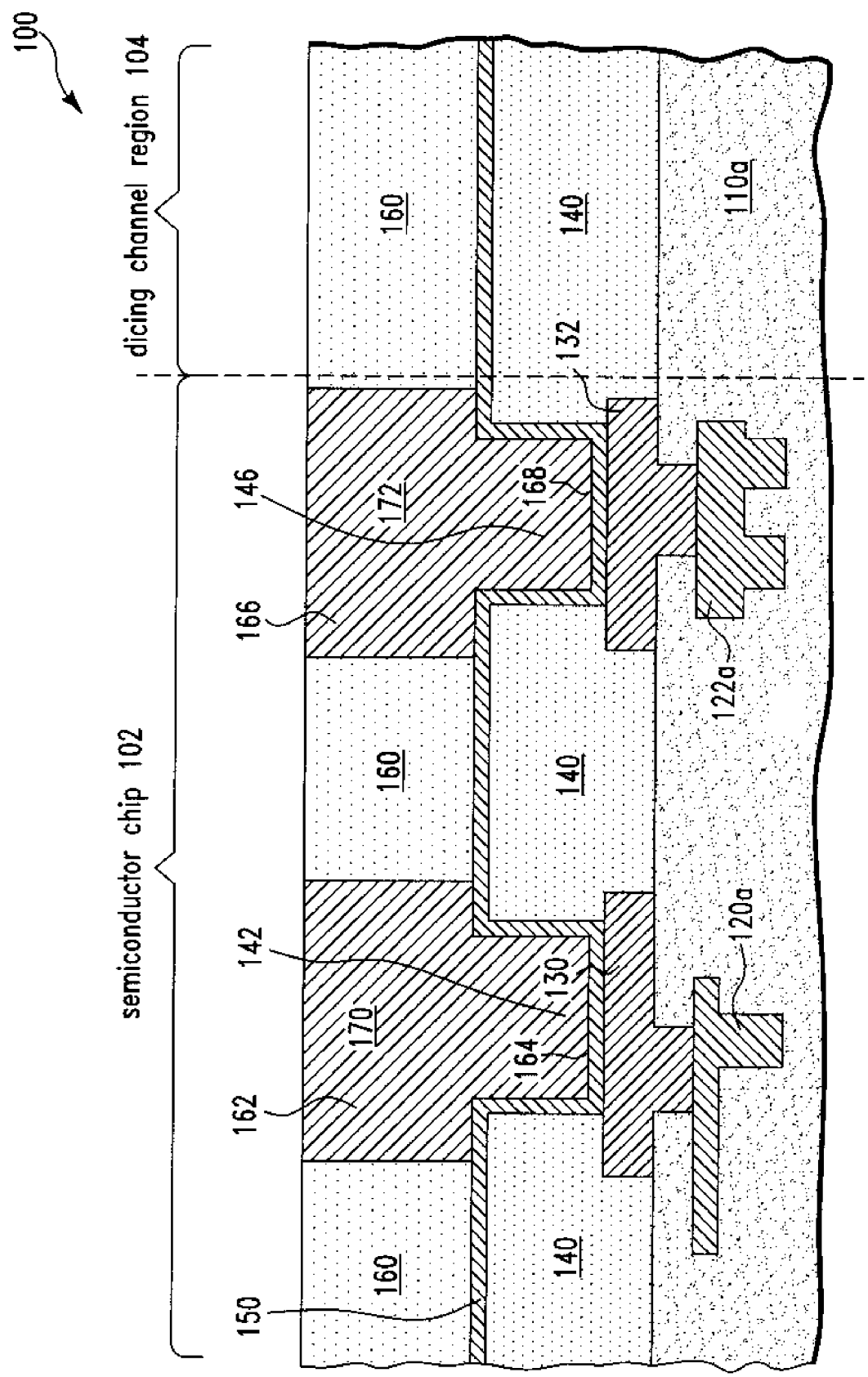

Next, with reference to FIG. 1E, in one embodiment, a patterned photo-resist layer 160 is formed on top of the BLM film 150. In one embodiment, the patterned photo-resist layer 160 is formed by using a conventional lithographic process. In one embodiment, the patterned photo-resist layer 160 comprises (i) a hole 162 aligned with the hole 142 and (ii) a trench 166 aligned with the trench 146 such that top surfaces 164 and 168 of the BLM film 150 are exposed to the surrounding ambient environment via the hole 162 and the trench 166, respectively. It should be noted that the holes 142 and 162 can be collectively referred to as a hole 142,162. Similarly, the trenches 146 and 166 can be collectively referred to as a trench 146,166. In one embodiment, the trench 146,166 runs on the perimeter of the semiconductor chip 102.

Next, in one embodiment, a solder bump 170 (comprising a mixture of lead (Pb) and tin (Sn) in one embodiment) and a solder wall 172 (comprising a mixture of Pb and Sn in one embodiment) are simultaneously formed in the hole 142,162 and the trench 146,166, respectively, by, illustratively, electroplating. More specifically, in one embodiment, the structure 100 is submerged in a solution (not shown) containing tin and lead ions. The BLM film 150 is electrically coupled to the cathode of an external dc (direct current) power supply (not shown), while the solution is electrically coupled to the anode of the dc supply. Under the electric field created in the solution by the dc power supply, tin and lead ions in the solution arrive at the exposed surfaces 164 and 168 of the BLM film 150 and deposit there forming the solder bump 170 and the solder wall 172, respectively, as shown in FIG. 1E. In one embodiment, the solder wall 172 runs along the trench 146, 166 (i.e. the solder wall 172 runs on the perimeter of the semiconductor chip 102).

Figure 1F:
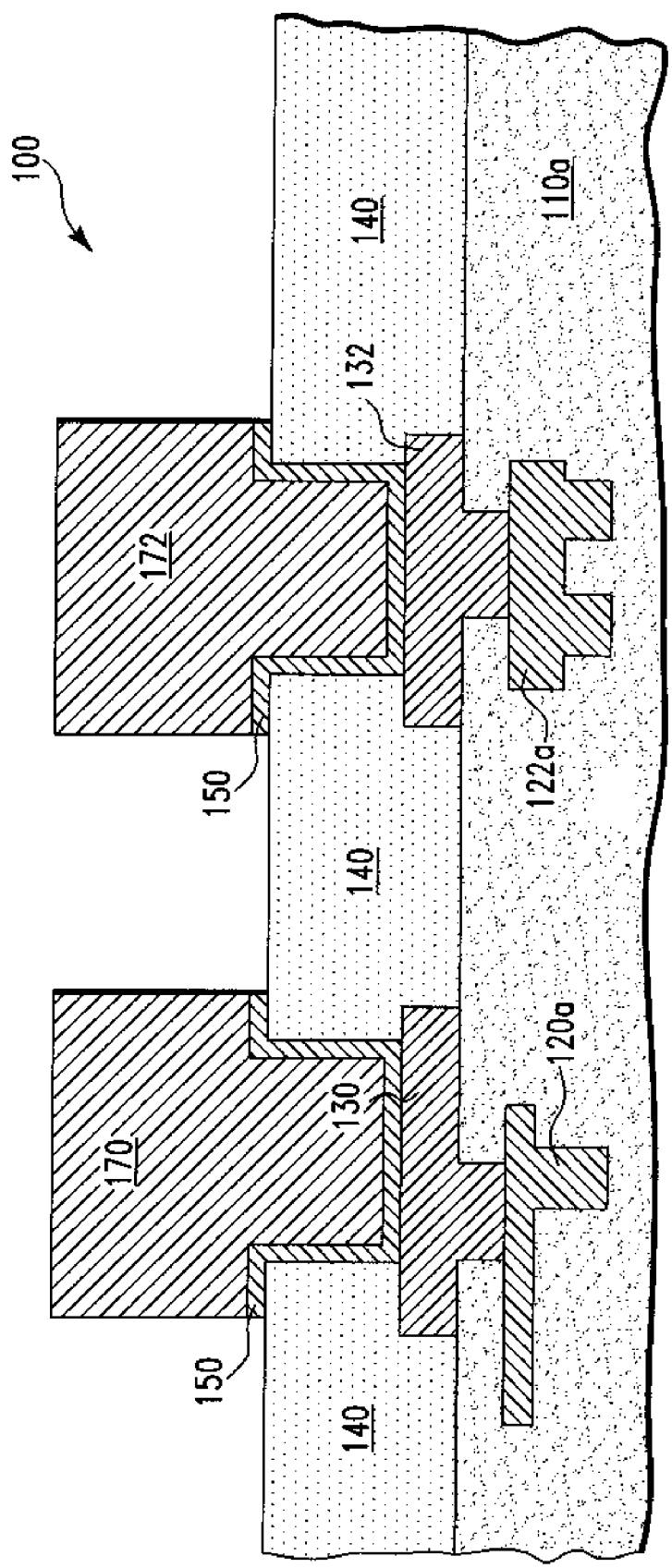
Figure 1F:
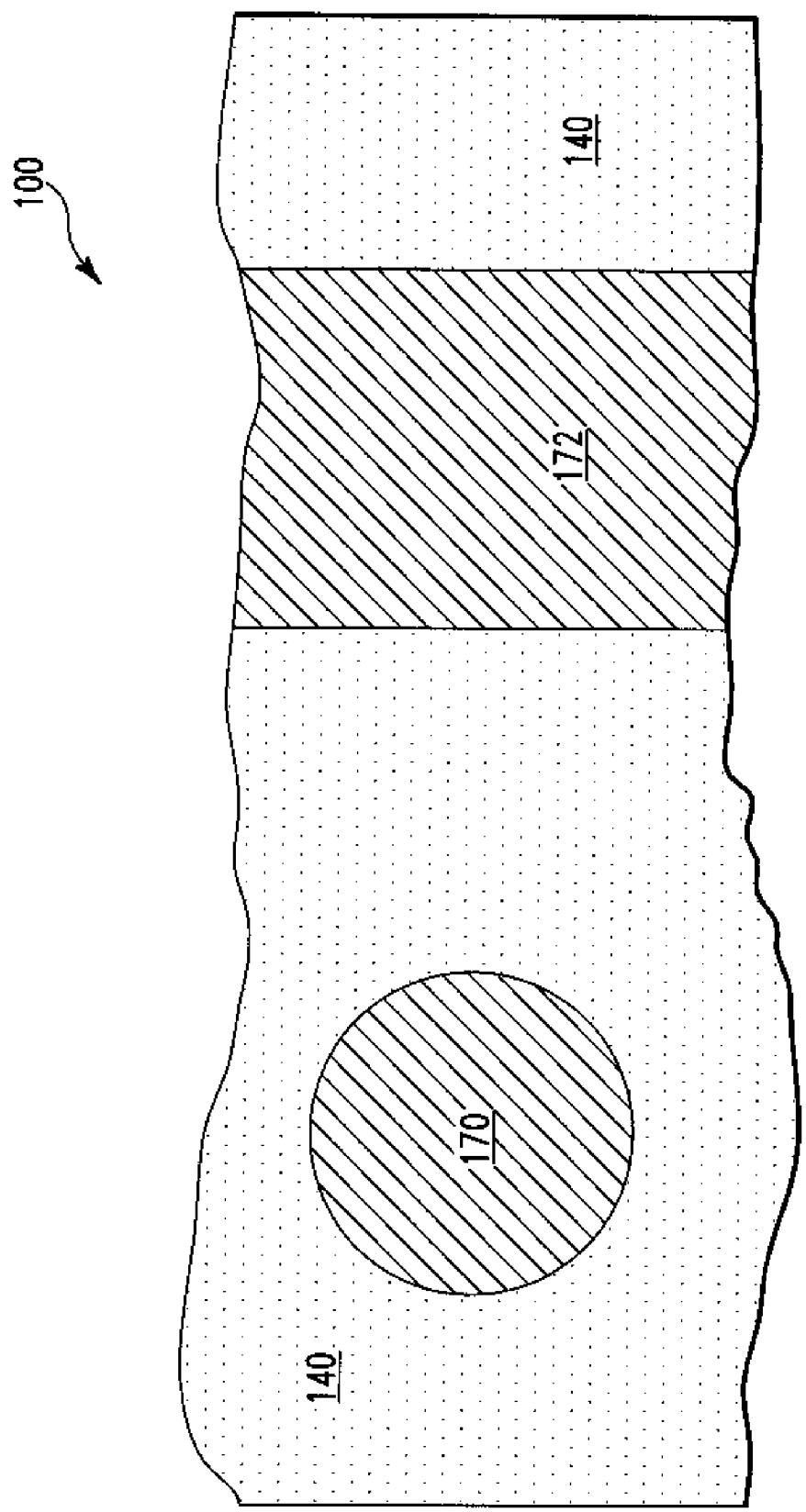

Next, in one embodiment, the patterned photo-resist layer 160 and portions of the BLM film 150 (that are not protected by the solder bump 170 and the solder wall 172) are removed by wet etching, RIE etching, or electro-etch, resulting in the solder bump 170, the solder wall 172, and BLM regions 150 of the structure 100 of FIG. 1F.

FIG. 1Fi shows a top-down view of the structure 100 of FIG. 1F, in accordance with embodiments of the present invention.

Figure 1G:
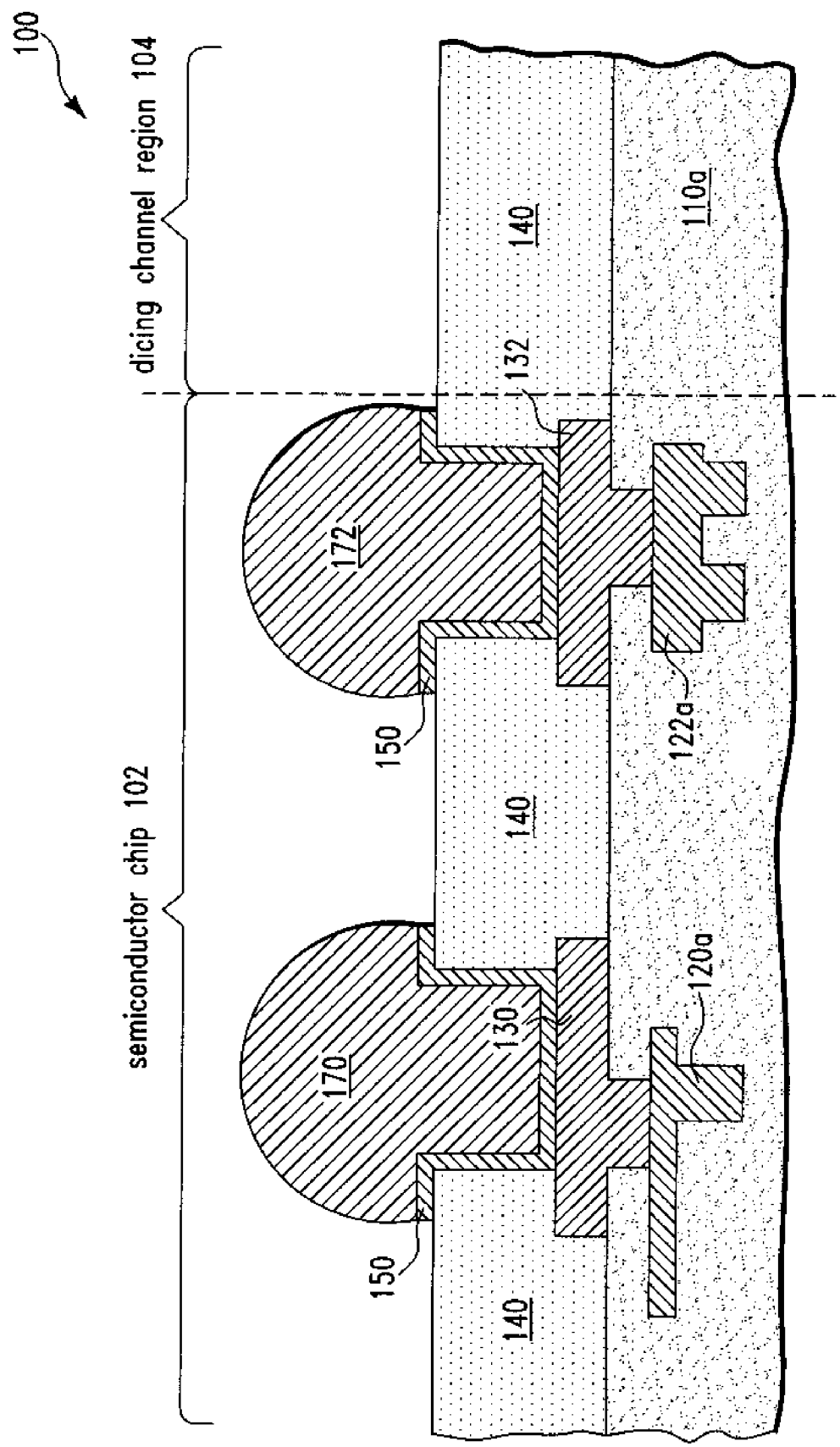
Figure 1G:
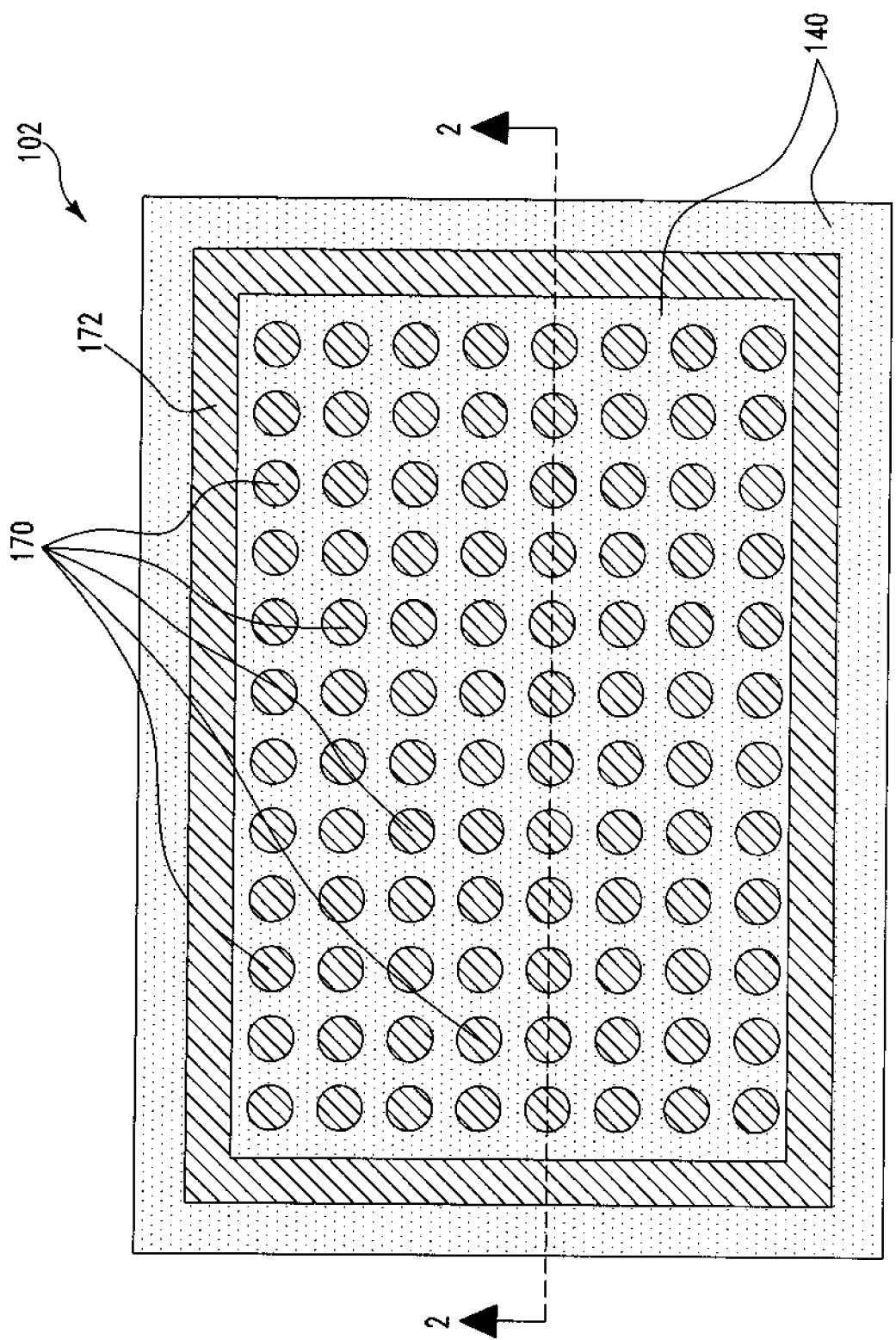

Next, in one embodiment, the solder bump 170 and the solder wall 172 of FIG. 1F are reflowed at a high temperature, resulting in structure 100 of FIG. 1G. Illustratively, the solder bump 170 and the solder wall 172 of FIG. 1F are reflowed by subjecting them to a temperature lower than 400° C.

Next, in one embodiment, the chip dicing process is performed wherein a blade (not shown) can be used to cut through the dicing channel region 104, resulting in the separated semiconductor chip 102 in FIG. 1Gi. FIG. 1Gi shows a top-down view of the chip 102 after it is cut from the structure 100 of FIG. 1G, in accordance with embodiments of the present invention. It should be noted that the chip 102 can have multiple solder bumps 170 (similar to the solder bump 170 of FIG. 1G). In one embodiment, these multiple solder bumps 170 and the solder wall 172 can be formed simultaneously using the fabrication process described above in FIGS. 1A-1G.

Figure 2:
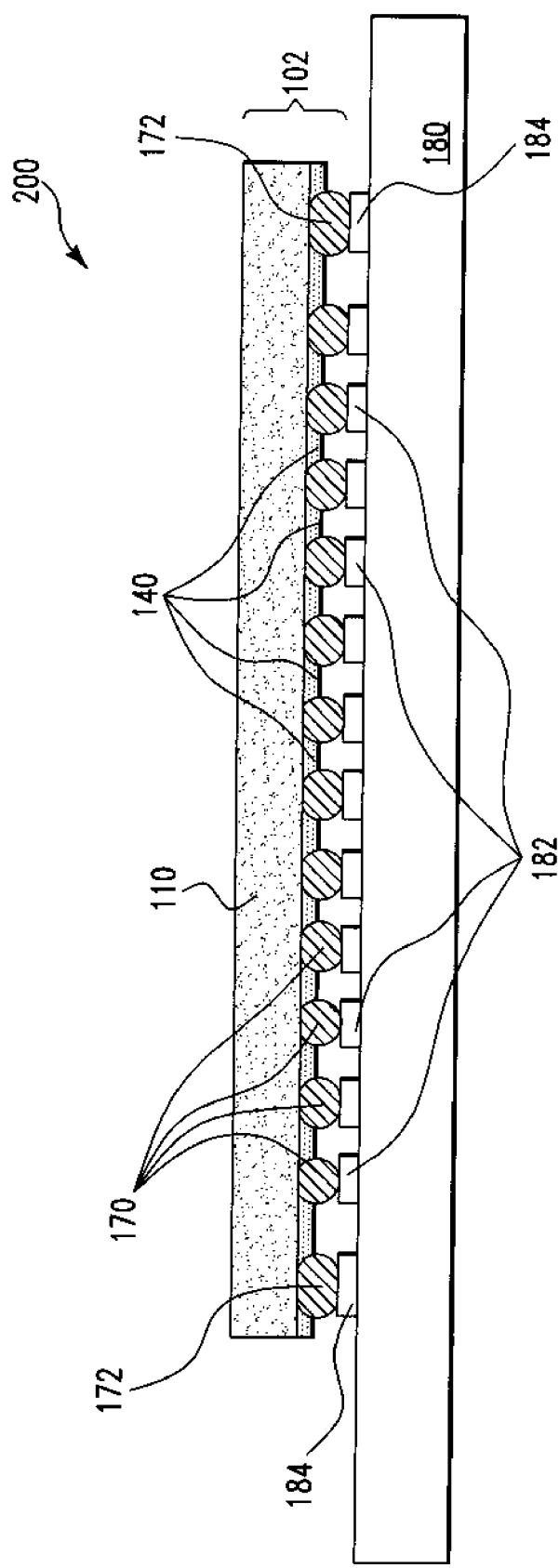
FIG. 2 illustrates a fabrication method for forming a module, in accordance with embodiments of the present invention.

Next, with reference to FIG. 2, in one embodiment, the chip 102 is flipped upside down and bonded to a module substrate 180 (comprising ceramic in one embodiment), resulting in a module 200 in FIG. 2. In one embodiment, the multiple solder bumps 170 are bonded one-to-one to multiple substrate bump pads 182 of the ceramic module substrate 180, whereas the solder wall 172 is bonded to a substrate wall pad 184 of the ceramic module substrate 180. It should be noted that the chip 102 in FIG. 2 is a cross-section view along a line 2-2 in FIG. 1Gi.

In one embodiment, other chips (not shown, but similar to the chip 102 of FIG. 1Gi) can be bonded to the same ceramic module substrate 180 in a similar manner so as to form the multi-chip module 200.

In summary, after the chip 102 is bonded to the ceramic module substrate 180, the solder bumps 170 of the chip 102 are isolated from carbon dioxide and water vapor of the surrounding ambient environment by the chip 102, the ceramic module substrate 180, and the solder wall 172.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:
providing a first semiconductor chip;
forming N solder bumps in direct physical contact with the first semiconductor chip, wherein N is a positive integer; and
forming a first solder wall on a perimeter of the first semiconductor chip such that the first solder wall forms a closed loop surrounding the N solder bumps,
wherein the first semiconductor chip comprises a crack stop on a perimeter of the first semiconductor chip, and
wherein the first solder wall is overlapping the crack stop.

* * * * *